HIGH FREQUENCY TUNER

Original Filed Jan. 13, 1958

INVENTORS

JAMES E. KREPPS, Jr. AND

MORTON L. WEIGEL

BY

Mason, Kolehmainen, Rathburn and Wyss.

ATTORNEYS

Jan. 4, 1966 J. E. KREPPS, JR., ETAL 3,227,981

HIGH FREQUENCY TUNER

Original Filed Jan. 13, 1958

4 Sheets-Sheet 2

INVENTORS
JAMES E. KREPPS, Jr. AND
MORTON L. WEIGEL

BY Mason, Kolehmainen, Rathburn and Wyss.

ATTORNEYS

INVENTORS
JAMES E. KREPPS, Jr. AND
MORTON L. WEIGEL
BY Mason, Kolehmainen, Rathburn and Wyss.
ATTORNEYS INVENTORS
JAMES E. KREPPS, Jr. AND
MORTON L. WEIGEL BY Mason, Kolehmainen, Rathburn and Wyss.

ATTORNEYS.

3,227,981
HIGH FREQUENCY TUNER

James Edgar Krepps, Jr., and Morton L. Weigel, Bloomington, Ind., assignors to Sarkes Tarzian, Inc., Bloomington, Ind., a corporation of Indiana Application June 28, 1961, Ser. No. 120,440, which is a continuation of application Ser. No. 708,594, Jan. 13, 1958. Divided and this application Dec. 30, 1963, Ser. No. 334,145
8 Claims. (Cl. 336—192)

The present invention is a division of our copending application Serial No. 120,440, filed June 28, 1961, which is itself a continuation of our application Serial No. 708,594, now abandoned.

The present invention relates to high frequency tuners and more particularly to turret type television tuners which include a plurality of tuned circuit elements mounted on a rotatable support and selectively rotatable into circuit relationship with the other elements of the tuner to determine the channel to which the associated television receiver is tuned.

Present-day television tuners are primarily of two types, one type including the switch tuners in which the tuned circuit elements are fixedly disposed and selectively switched into operative relationship with the other tuner circuits, and the other type including the turret tuners in which the tuned circuit elements are rotatably mounted for selective movement into circuit relationship with the other tuner circuits. In order to minimize the manufacturing cost of television tuners and to provide uniformity of operation for all tuners of the same design, it would be desirable to employ mechanized production lines to effect automatic assembly of the entire tuner or at least the principal parts thereof. The turret type tuner and particularly the tuned circuit portions thereof appear to be the best suited for automatic assembly.

Therefore, a principal object of the present invention is to provide a new and improved turret tuner for use in television receivers.

A further object of the present invention is to provide a television tuner having certain components which are adapted to be assembled by automatic assembly apparatus.

A further object of the present invention is to provide a new and improved multiple inductance unit which is particularly suited for use in television tuners.

Another object of this invention is to provide a new and improved trimmer capacitor.

Still another object of this invention is to provide a new and improved turret type tuner and a method for assembling it.

Briefly, the above and further objects are realized in accordance with the present invention by providing a turret type television tuner comprising a rotatable turret on which is mounted a plurality of inductance units which respectively include all of the tuning coils for each channel position of the turret. Each of the inductance units comprises a single coil form on which all of the coils for a given channel are wound, and each coil form includes a plurality of terminal members which are mounted directly thereon for cooperating with a plurality of contact brushes which are fixedly mounted on the chassis of the tuner, thereby to connect the coils of a selected inductance unit in circuit relationship with the stationary components of the tuner circuit. These inductance units may be completely assembled by automatic assembly apparatus and are each mounted in a plurality of respective peripherally disposed recesses in a plurality of spacer discs, the discs being spatially arranged along the main tuning shaft. A suitable securing means, such, for example, as an elastic band, may surround all of the inductance units simultaneously to bias them toward the tuning shaft and thus to press them into the recesses in the discs.

In accordance with an important aspect of the present invention the tuner may be assembled in the following manner. Initially, the spacer discs and inductance units are mounted on the tuning shaft and the tuning shaft is journaled in the front wall member of the chassis, the front wall being separable from the remainder of the chassis. Thereafter, the rear end of the tuning shaft is inserted into a suitable aperture in the rear wall of an integral L-shaped chassis member including a deck portion, and finally the front wall of the chassis is secured to the deck of the L-shaped chassis member. The contact brushes are mounted on an insulating board adjacent the deck of the chassis, and since the brushes are resilient only in a direction radial to the tuning shaft, in order to facilitate assembly of the tuner, the aperture in the rear wall is elongated to enable movement of the turret past the contact brushes during assembly of the tuner. After the turret is in place in the L-shaped chassis member so that the terminals are opposite the brushes, the turret is moved toward the deck by sliding the tuning shaft along the aperture in the rear wall. In order to insure good contact between the terminals and the contact brushes when the tuner is completely assembled, a spring may be mounted between the rear wall and the adjacent portion of the tuning shaft to bias the tuning shaft toward the deck.

In accordance with another aspect of the present invention there is provided a trimmer capacitor which is particularly suited for use with a tuner of the type disclosed herein. This trimmer capacitor provides the vernier tuning control for the tuner and comprises an irregularly shaped dielectric member of planar configuration which is interposed between the front wall of the chassis and a capacitor plate. The latter plate is mounted on, and insulated from, the top deck of the chassis and lies in a plane substantially parallel to the front wall of the chassis. In a preferred embodiment of this invention an annularly grooved insulating collar is mounted on the tuning shaft adjacent the dielectric member and receives the marginal end of the capacitor plate to maintain the plate at a fixed distance from the adjacent front wall of the chassis thereby to insure consistent vernier tuning operation.

The invention, both as to its organization and method of operation, together with further objects and advantages thereof, will best be understood by reference to the following description, taken in conjunction with the accompanying drawings, in which.

Figure 1:
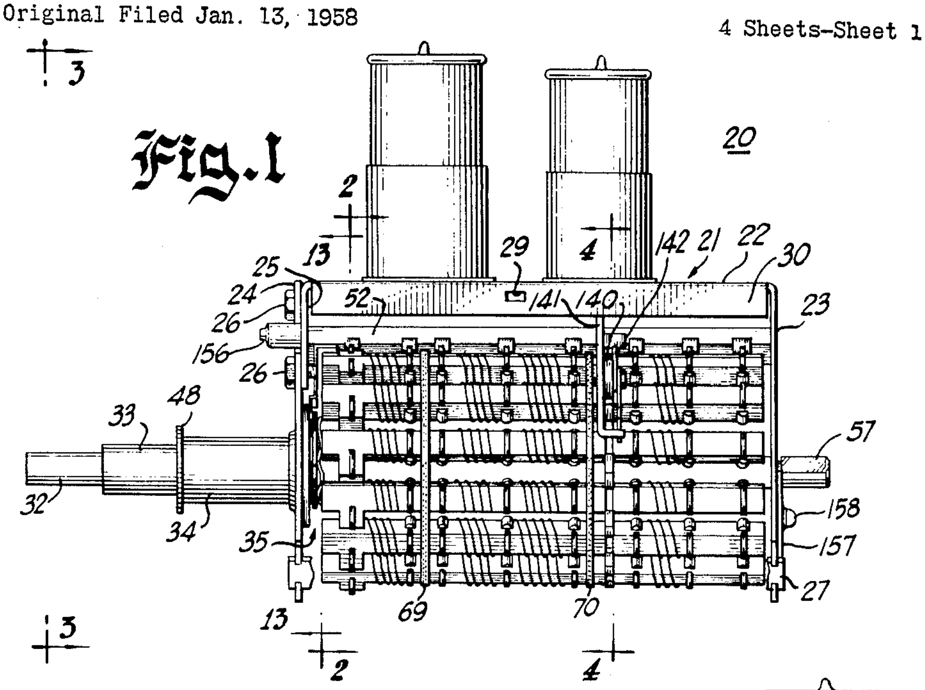
FIG. 1 is a side elevational view of a turret tuner having the outer shield removed, certain circuit elements also being removed for purposes of clarity.

Referring now to the drawings and particularly to FIG. 1 thereof, a television tuner 20 comprises a chassis 21 including an integral L-shaped member forming an upper deck 22 and a rear wall 23. The chassis 21 further includes a front wall 24 which is secured to a depending flange 25 on the forward end of the deck 22 by means of two headed screws 26. In addition, the end walls 23 and 24 are secured to one another by a pair of tie bars 27 and 28 which are respectively interconnected between the end walls 23 and 24 near the bottoms thereof. Consequently, a predetermined spacing is maintained between the upper portions of the end walls 23 and 24 by the deck 22 and the same spacing is maintained between the bottom portions of the end walls 23 and 24 by the tie bars 27 and 28. Accordingly, the walls 23 and 24 are maintained in substantially parallel relationship.

Figure 4:
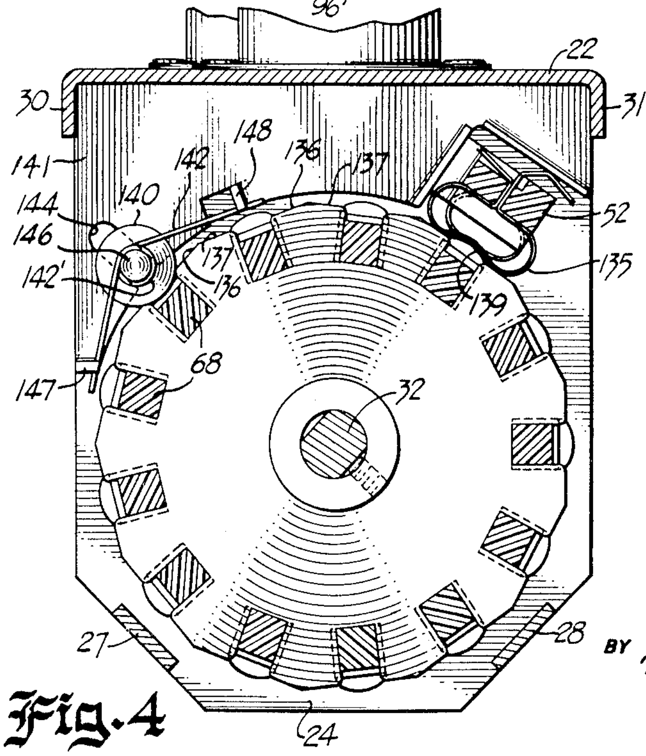
FIG. 4 is a sectional view of the tuner of FIG. 1 taken along the line 4—4 thereof.
Figure 9:
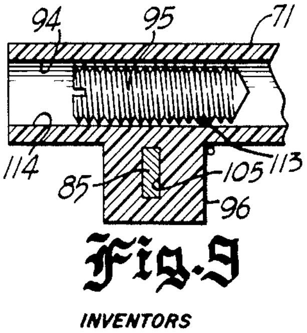
FIG. 9 is a fragmentary sectional view showing a tuning slug threadedly received in one end of the inductance unit of FIG. 5.

In order to increase the rigidity of the tuner 24 and particularly of the deck 22, a pair of depending side flanges 30 and 31, best shown in FIG. 4, are provided on the deck 22 and depend a short distance along the end plates 23 and 24. A suitable aperture 29 is provided in each of the flanges 30 and 31 to receive suitable mounting tabs on a conventional shield member (not shown).

In order to mount a set of concentric tuning shafts 32 and 33 in the chassis 21, a forwardly extending bearing sleeve 34 is secured by suitable means such as staking in an aperture in the front plate 24. The inner shaft 32 is the main tuning shaft which is incrementally rotatable to enable adjustment of the particular channel to which the tuner 20 is tuned, and the outer shaft 33, which is rotatable independently of the main tuning shaft 32 and is the vernier control shaft, is connected to a trimmer capacitor 35 which is mounted on the rear wall of the end plate 24.

Figures 10, 11, 12:
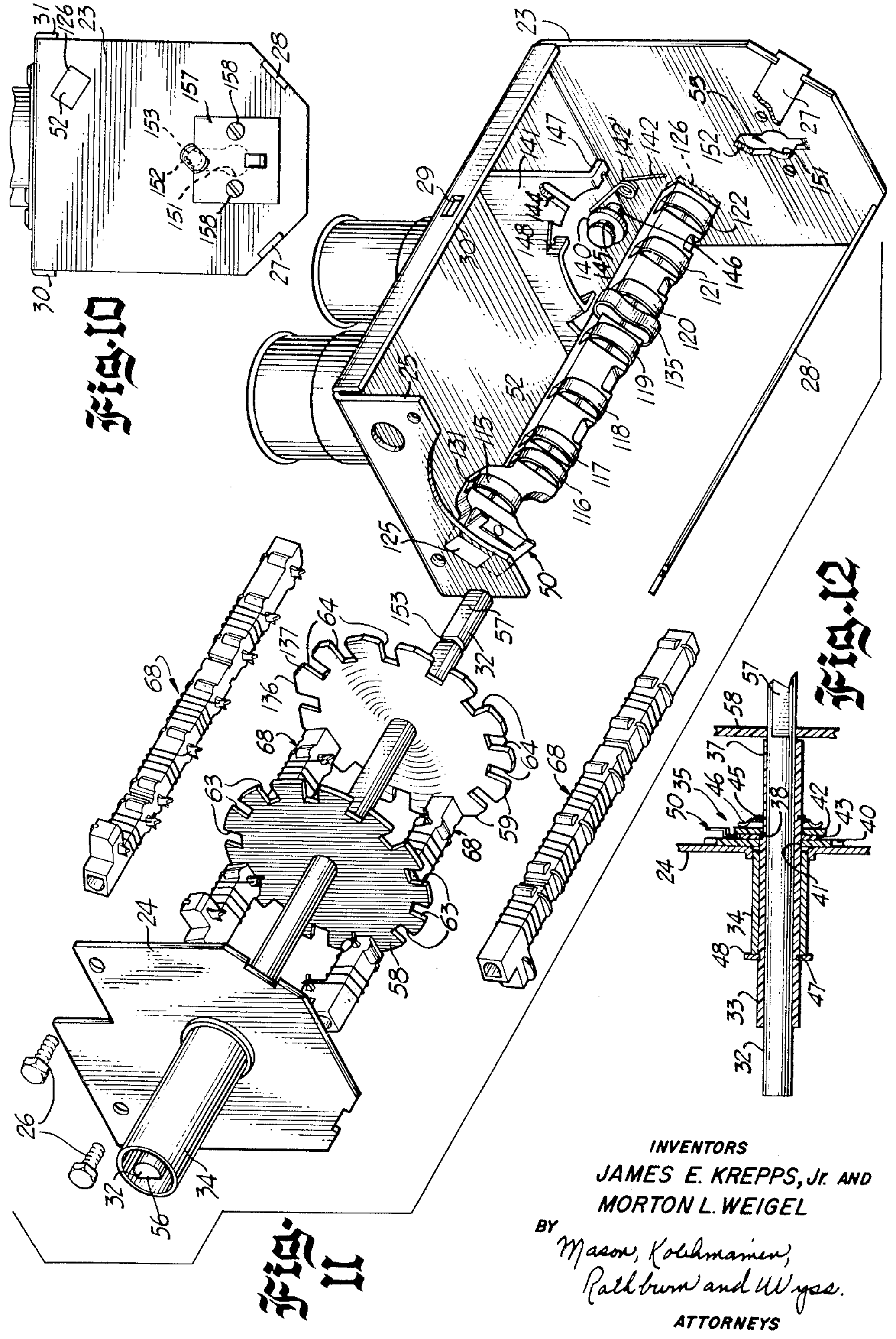
FIG. 10 is a rear view of the tuner of FIG. 1 taken from along the line 10—10 thereof.
FIG. 11 is an exploded perspective view of a portion of the tuner of FIG. 1.
FIG. 12 is a sectional view taken along the line 12—12 of FIG. 3.

In order to secure the fine tuning shaft 33 and the trimmer capacitor 35 to the front plate 24, the shaft 33, as shown in FIG. 12, is provided with a flat axial surface 37 near the rear end thereof to provide a shoulder 38. A circular dielectric disc 40 is provided with an aperture 41 displaced from the center of the disc 40, the aperture 41 having a flat portion so that it corresponds to the rear end of the fine tuning shaft 33. Consequently, the dielectric disc 40 may be slipped onto the rear end of the shaft 33 and provides a dielectric member which is eccentrically configured with respect to the principal axis of the shaft 33. A circular disc 42 of smaller diameter than the eccentric disc 40 is provided with a circular aperture and is positioned on the shaft 33 aft of the disc 40, and a thin spacer disc 43 is interposed between the discs 40 and 42. An annular groove 44 is provided near the rear end of the shaft 33 to fixedly position a split ring type washer 45 which provides a stop against which an annular spring 46 abuts. As shown, the spring 46 is interposed between the disc 42 and the stop 45.

In assembling the tuner 20, the discs 40, 42, 43, the spring 46, and the washer 44 are assembled to the shaft 33 which is then inserted into the front wall 24 and associated sleeve 34 from the rear end thereof until an annular slot 47 provided near the forward end of the shaft 33 is forwardly disposed with respect to the forward end of the sleeve 34. With the shaft 33 in this position, the spring 46 is slightly compressed and tends to pull the forward end of the shaft 33 toward the front wall 24. Therefore, a split ring type washer 48 is placed in the slot 47 and inasmuch as the external diameter of the washer 48 exceeds that of the sleeve 34, the disc 40 is resiliently pressed against the wall 24 and the shaft 33 is secured to the wall 24.

The front wall 24 constitutes one plate of the trimmer capacitor 35, the other plate of the capacitor 35 being constituted by a conductive member 50 which is secured by suitable means to a terminal strip 52. The terminal strip 52, which is formed of an insulating material, is mounted in close proximity to the deck 22 and the capacitor plate 50 depends therefrom near the wall 24. The plate 50 includes a pair of arms 51 and a generally rectangular end portion 51′ which is offset from the arms 51 and lies in proximity to the wall 24. The lowermost part of the end portion 51′ is coplanar with the spacer disc 43 and is slidably held between the eccentric 40 and the circular disc 42. The capacitor plate 50 is thus captured by the disc 42 which resiliently bears against it and maintains the plate 50 at a fixed distance from the front wall 24. Accordingly, since the dielectric disc 40 is eccentrically mounted on the shaft 33, rotation of this shaft 33 varies the area of the dielectric member 40 which is interposed between the plate portion 51′ and the front wall 24, thereby to vary the capacitance value of the trimmer capacitor 35. The manner in which the capacitor 35 is connected in circuit relationship with the oscillator section of the tuner in order to provide for fine tuning of the frequency of oscillation thereof is described hereinafter in connection with FIG. 14.

The main tuning shaft 32 is journaled near the forward end thereof in the vernier tuning control shaft 33 and is journaled at its rearward end in a keyhole aperture 55 in the rear chassis wall 23. Suitable axially directed flats 56 and 57 are provided on the forward and rearward ends of the shaft 32 and a pair of spacer discs 58 and 59 are mounted in spaced apart relationship on the portion of the shaft 32 including the flat 57. The discs 58 and 59 are provided with central apertures corresponding in configuration to the cross section of the shaft 32 so that the disc 58 and 59 are automatically maintained in registry with one another and with the axial flat 56 of the front of the shaft 32.

As best shown in FIG. 11, the spacer disc 58 is formed of an insulating material and is provided with thirteen rectangular notches 63 in the periphery thereof, and the disc 59, which is formed of a conductive material, is also provided with thirteen notches 64 in the periphery thereof. The notches 63 are aligned with respective ones of the notches 64 in a direction axially of the main tuning shaft 32, and suitable means (not shown) are provided for fixedly positioning the discs 58 and 59 on the shaft 32 in the illustrated position.

In accordance with an important feature of the present invention, thirteen multiple inductance units 68 are respectively mounted in aligned ones of the notches 63 and 64 and all thirteen of the inductance units 68 are held in an assembled relationship with respect to the discs 58 and 59 by means of a pair of annular elastic bands 69 and 70 which surround the inductance units 68 and resiliently press them into the bottom of the notches 63 and 64. The inductance units 68 each include all of the tuned circuit elements which are necessary to tune the antenna stage, RF amplifier stage, mixer stage, and oscillator stage of the tuner for each channel selecting position of the main tuning shaft 32, one of the units 68 being used when the associated receiver is operated to receive signals in the UHF frequency range.

Figures 5, 6, 7, 8:
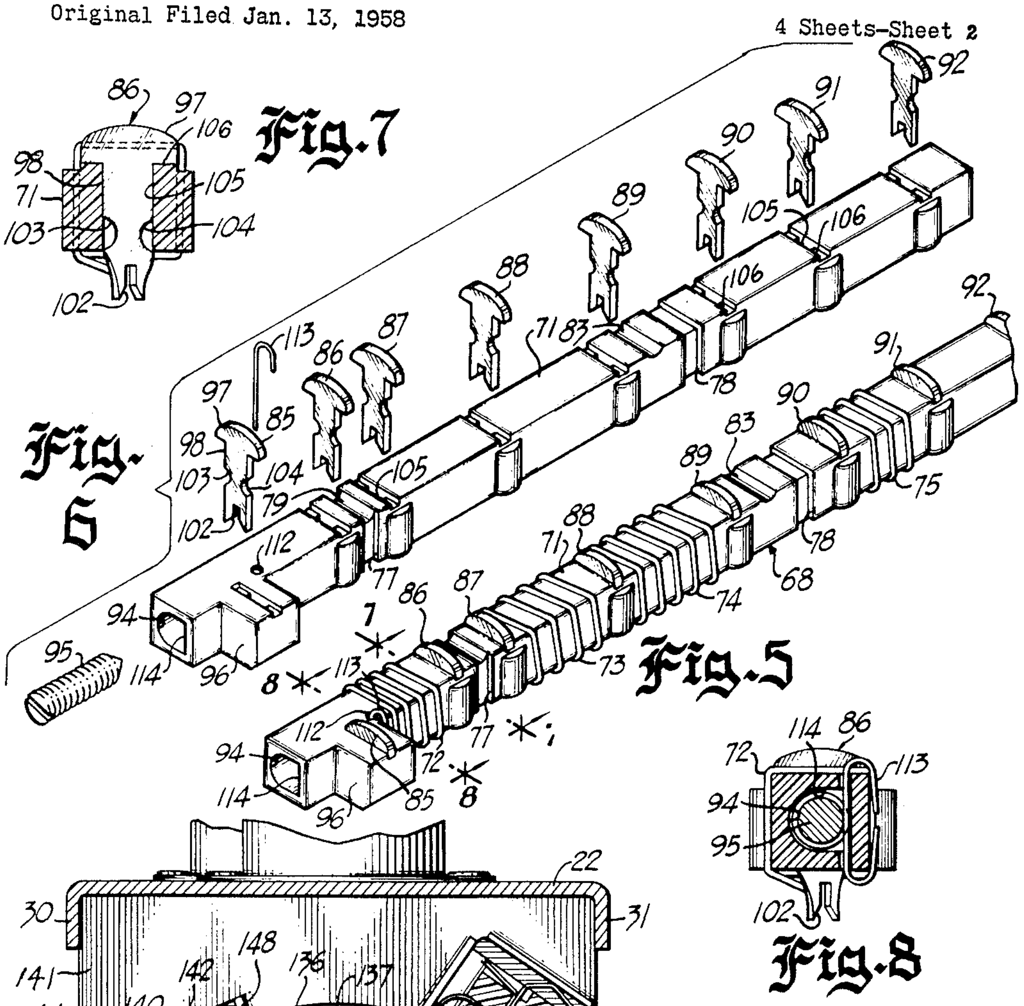
FIG. 5 is a fragmentary perspective view of a multiple inductance unit employed in the tuner of the present invention.
FIG. 6 is an exploded perspective view of the coil form of the inductance unit of FIG. 5.
FIG. 7 is a sectional view of the inductance unit of FIG. 5 taken along the line 7—7 thereof.
FIG. 8 is a sectional view of the inductance unit of FIG. 5 taken along the line 8—8 thereof.

As best shown in FIG. 5, each of the inductance units 68 comprises a generally rectangular, elongated insulating coil form and support member 71 around which is wound a plurality of coils 72, 73, 74, and 75. In order to prevent axial movement of the inductance units relative to the shaft 32, the notches 63 and 64 are slightly narrower than the corresponding dimension of the coil forms 71, and peripheral grooves 77 and 78 are provided in the coil form 71 at the locations of the spacer discs 58 and 59. The outer portion 79 of the groove 77, the top as viewed in FIG. 5, has a concave bottom surface for reception of the elastic band 69.

Since the band 70 is disposed between the discs 58 and 59, a groove 83 having a concave bottom portion is interposed between the groove 78 and the coil 74 to receive the elastic band 70.

Figures 13, 14:
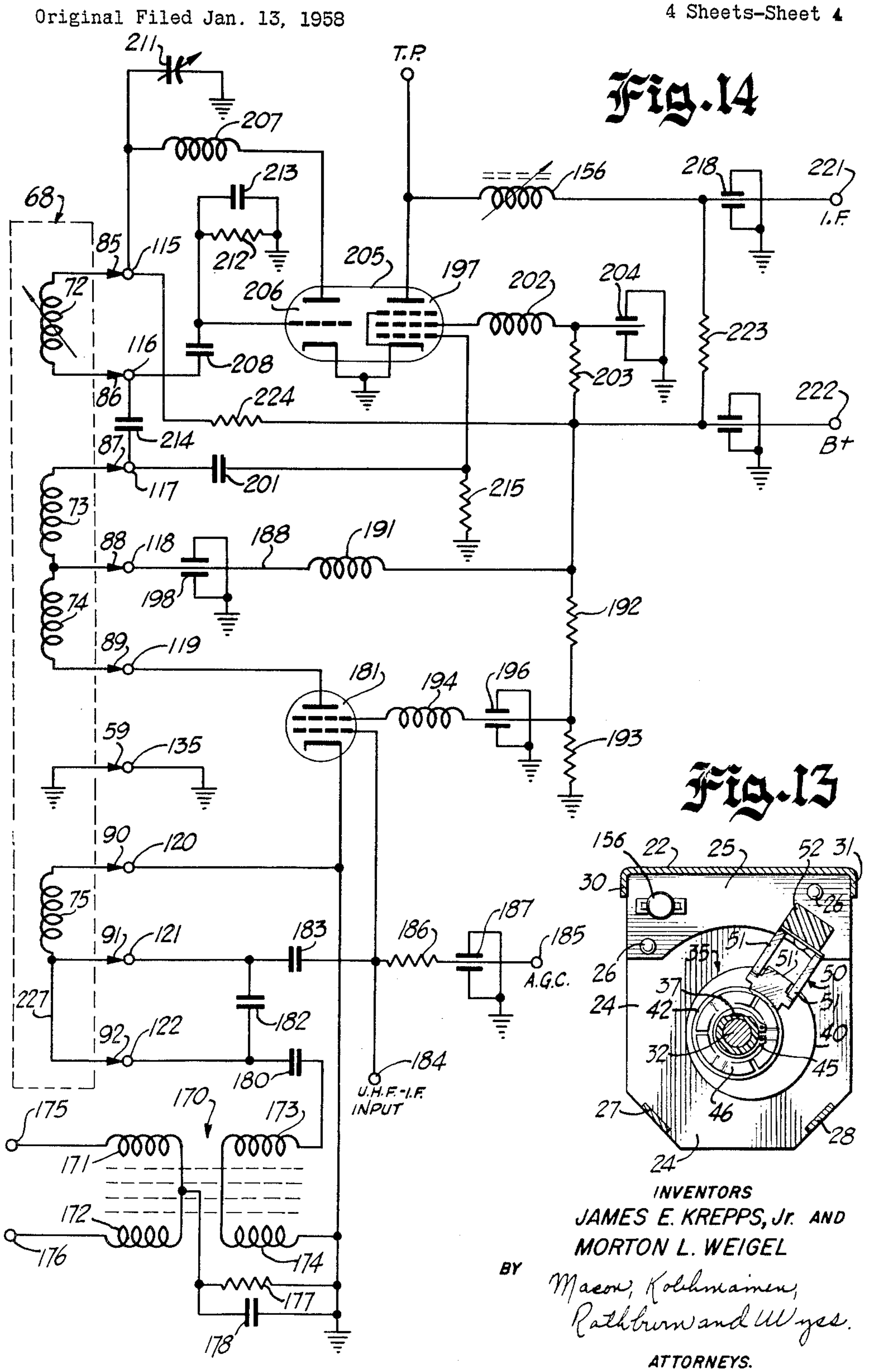
FIG. 13 is a sectional view taken along the line 13—13 of FIG. 1.
FIG. 14 is a schematic diagram of the electric circuit of the tuner of the present invention.

In accordance with the present invention, a plurality of conductive terminal members 85, 86, 87, 88, 89, 90, 91, and 92 are secured directly to the coil form 71 and the ends of the coils 73–75 are connected to respective ones of these terminals. Since the coils 73 and 74 are, respectively, the mixer and the local oscillator coils, and terminal 88 is common to both coils and is interconnected between them. Moreover, the terminal 92 is not connected to any of the coils and, as described more fully hereinafter in connection with FIG. 14, is provided for antenna switching.

Since it is desirable to enable fine adjustment of the local oscillator plate circuit inductance, which inductance is primarily constituted by the winding 72, an axial bore 94 is provided in the end of the coil form 71 adjacent the winding 72 and the bore 94 extends at least partially within the winding 72. A threaded brass core 95 is axially adjustable in the bore 94 to provide adjustment of the inductance value of the coil 72. Since, as best shown in FIG. 6, the terminals 85 through 92 extend completely through mounting apertures in the coil form 71, the terminal member 85, which is connected to the coil 72, is mounted in an offset portion 96 of the coil form 71. The provision of the offset portion 96 for mounting the terminal 85 thus provides a construction wherein interference with the movement of the core 95 past the terminal 85 is simply avoided.

Referring particularly to FIGS. 6 and 7, it may be seen that the terminal members 85–92 are identical and each comprises an arcuate head 97 and a shank 98. The bottom of the shank 98 is bifurcated by means of an axially directed notch 102 and arcuate notches 103 and 104 are provided in directly opposite edges of the shank 98 at a distance from the head 97 equal to the corresponding thickness of the coil form 71. The coil form 71 is provided with a plurality of rectangularly shaped apertures 105 for receiving the shanks of the respective terminals 85–92. Also, a plurality of rectangular grooves 106 having substantially the same thickness as the terminals are provided for receiving a portion of the head 97. Consequently, when each terminal is inserted into the forms 71 from the tops thereof, as shown in FIG. 6, into the apertures 105, the bifurcated lower portions extend beneath the coil form 71 and the section of reduced dimension defined by the notches 103 and 104 is directly beneath the bottom surface of the form. With the terminals thus in place a suitable fixture may be employed to twist all of the bottom portions of the terminals thus preventing removal of the terminals from the form. Moreover, by twisting all of the terminals at a common angle, winding of the coils 72–74 by automatic winding apparatus is facilitated. Apparatus for automatically winding the coils on the forms after the terminals have been put in place is disclosed in copending application, Serial No. 802,221, now abandoned, filed March 26, 1959, and assigned to the same assignee as the present invention. As the coils 72–75 are wound on the form 71, the wire is inserted into the notches 102 and thereafter soldered. Preferably, all of the coils on each inductance unit 68 are wound of the same type and size of wire so that the coils may all be wound in one operation, and the portions of the wire which may be located between terminals which should not be interconnected are later removed.

In order to provide a mating thread for the external thread on the tuning slug 95, which is used to adjust the inductance value of the coil 72, a transverse hole 112 is provided in the core 71 and intersects the bore 94. A suitable filament or wire 113 extends through the hole 112 and as best shown in FIG. 8 is folded back over the adjacent side of the core 71 to fix the wire 113 to the core 71. The diameter of the wire 113 is slightly less than the distance between the threads of the slug 95 thereby to provide a single thread which engages the thread of the slug 95 and maintains the slug 95 in an adjustable position within the coil 72.

Preferably, the bore 94 and the hole 112 are formed when the coil form 71 is molded, the coil form 71 being made of a suitable moldable insulating material such as a thermo-setting plastic. Therefore, in order to facilitate molding of the transversely intersecting holes 94 and 112, the bore 94 is substantially D-shaped and the hole 112 extends adjacent to the flat side 114 of the D. When the coil forms 71 are molded, a very thin flashing may remain between the inner ends of the hole 112 and the bore 94. Since, however, these flashings are perpendicular to the axis of the hole 112, when the wire 113 is pushed through the hole 112, the flashings are easily broken away. If, however, the bore 94 were cylindrical the wire 113 in being inserted through the hole 112 would engage the flashings at an angle and since the wire 113 is very thin and flexible, in engaging the flashing from within the bore 94 it would be deflected away from the hole 112 thus making assembly quite difficult.

Referring particularly to FIGS. 4 and 11, a plurality of resilient brushes 115, 116, 117, 118, 119, 120, 121, and 122 are mounted on the insulating terminal board 52 in order to connect the terminals 85–92 of the selected one of the inductance units 68 to the stationary circuit components of the tuner 20. The brushes 115–122 are displaced from one another by distances corresponding to the distances between the terminals 85–92 and the brush 115 is offset from the others for simultaneous engagement with the offset terminal 85.

The terminal board 52 is mounted on the L-shaped chassis member directly beneath the deck 22 and the brushes 115–122 are connected to the stationary components of the tuner in the manner illustrated in FIG. 14. Considered in greater detail, the front and rear end portions 125 and 126 of the terminal board 52 are rectangular in cross section and are respectively received in rectangular apertures in the depending flange 25 and the rear wall 23. Accordingly, the terminal board 52 may be assembled to the chassis 21 before the front wall 24 and the turret are assembled thereto.

Figure 2:
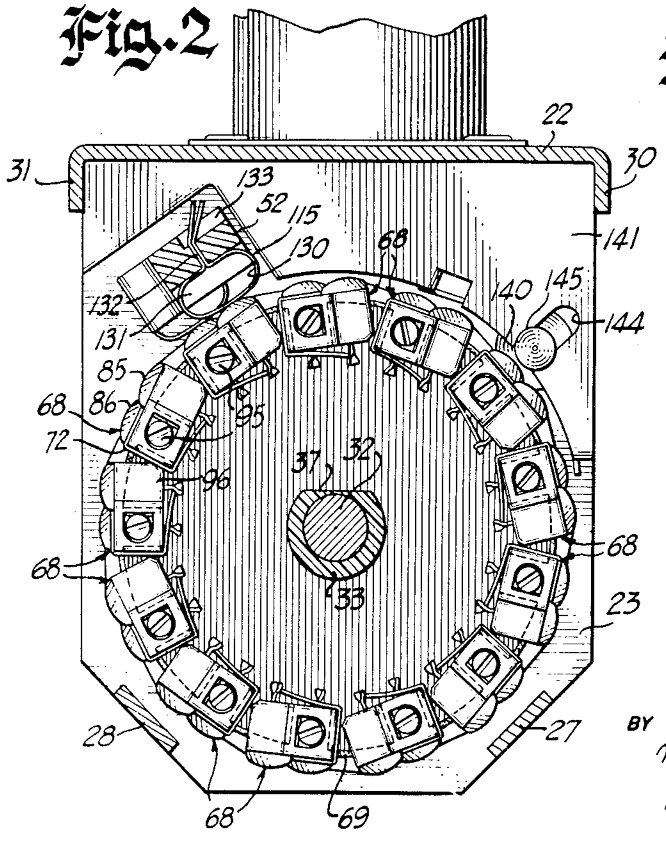
FIG. 2 is a fragmentary sectional view of the tuner of FIG. 1 taken along the line 2—2 thereof.
Figure 3:
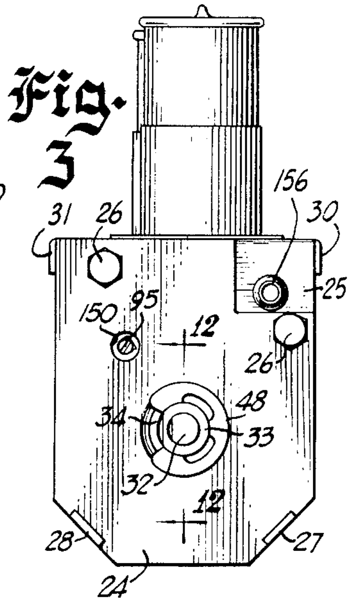
FIG. 3 is a front view of the tuner of FIG. 1 taken from along the line 3—3 thereof.

As best shown in FIG. 2, the contact brush 115, which is identical to the other brushes 116–122, is formed of a resilient band of a conductive spring metal which is folded back on itself to provide a loop 130 which lies partially in a recess 131 in the board 52. An aperture 132 which opens into the groove 131 extends through the board 52. The adjoining ends of the brush 115 are inserted through the aperture 132 and extend through a recess 133 at the opposite side of the board. In the recess 133, the ends of the brush 115 are partially spread apart to prevent removal of the brush 115 from the terminal board 52 and to provide a convenient terminal for soldering thereto the leads of the stationary components of the tuner.

In order to prevent interference between the antenna circuits and the other stages of the tuner, it is desirable to shield the antenna stage from the adjoining RF output stage. Accordingly, a shield is provided to compartmentalize the tuner 20 into an antenna compartment which is separate from the remainder of the tuner. The conductive spacer disc 59 provides a portion of this shield, and, therefore, is disposed between the antenna or RF input section of the tuner and the RF output section. A separate brush 135 is mounted on the terminal board 52 for continuously engaging the disc 59, and as best shown in FIG. 11, the portions of the disc 59 which are interposed between the notches 64 are generally triangular, each protruding portion being formed by a pair of outwardly directed flats 136 and 137. The reason for this triangular configuration is described in greater detail hereinafter in connection with the detent mechanism for insuring that for each stable angular position of the main tuning shaft 32 one of the inductance units 68 is in engagement with the brushes 115–122.

The brushes 115–122 are adapted to engage the convex terminal heads of the inductance units 68, but the brush 135 must engage the spacer or shielding disc 59 rather than the units 68. Accordingly, as best shown in FIG. 4, the brush 135 has a concave central portion 139 which overlies the coil form 71 of the selected one of the inductance units 68 which is in engagement with the brushes 115–122, and the portions of the brush 135 on opposite sides of the cavity engage the triangular outstanding portions of the disc 59 which are on opposite sides of the associated notches 64.

In order to insure that the main tuning shaft 32 may rest in only those angular positions wherein a selected one of the inductance devices 68 is connected through the brushes 115–122 to the remaining circuits of the tuner, a detent wheel 140, best shown in FIGS. 2, 4 and 11, is spring mounted on a shielding bracket 141 which is secured to the deck 22 in a position corresponding to that of the conductive spacer disc 59. The bracket 141 thus also cooperates with the disc 59 to shield the RF input circuits from the remainder of the tuner. When the shaft 32 is positioned so that the sloping portions 136 or 137 engage the wheel 140 the resilient force provided by a coil spring 142 acting through the wheel 140 which is rotatably mounted within the bracket 141 exerts a tangential force on the disc 59 to urge it in one angular direction or the other until the wheel 140 is directly opposite one of the notches 64. Consequently, incremental rotation of the shaft 32 is insured.

Considered in greater detail, the bracket 141 is secured to the deck 22 as by welding or the like, the depending side flanges 30 and 31 on the deck 22 serving to provide a better support for the bracket 141. A slot 144 in the bracket 141 extends radially of the shaft 32 and provides a bearing support for a forwardly extending hub 145 on the detent wheel 140. The hub 145 is provided with an annular groove at the location of the bracket 141 to prevent axial movement of the wheel 140 in the bracket 141. The coil spring 142 has a central loop portion 142′ which surrounds a rearwardly extending hub 146 on the wheel 140. The ends of the spring are engaged by suitable offset tabs 147 and 148 on the bracket 141 so that the wheel 140 is resiliently biased toward the turret.

In assembling the tuner 20 the various circuit components and the tube sockets are mounted on the deck 22, and the terminal board 52 is mounted on the chassis and electrically connected to the associated circuit components. The trimmer capacitor 35 and the vernier tuning control shaft 33 are then secured to the front wall 24 in the manner described hereinbefore. The spacer discs 58 and 59 are then assembled to the main tuning shaft 32 and the previously assembled inductance units 68 are secured thereto and held in place by the elastic bands 69 and 70 which are expanded and slipped over the turret to their proper positions. The forward portion of the shaft 32 is then inserted from the rearward side of the plate 24 into the shaft 33 until a suitable stop on the shaft 32 engages the split washer 45. With the shaft 32 in this position, the forward portions of the inductance units 68 are properly spaced from the front wall 24, and the one of the inductance units 68 which will be in engagement with the brushes on the terminal board 52 when the tuner is completely assembled is directly opposite an aperture 150 in the front wall 24. The detent wheel 140 and associated spring 142 are assembled to the bracket 141 and the rear end of the shaft 32 is then inserted into the enlarged circular portion 151 of the aperture 55. The aperture 55 has a keyhole shape with a V-shaped bottom 152 opposite the enlarged circular portion 151. With the shaft 32 in the portion 151 of the aperture 55, the inductance units 68 are displaced from the contact brushes 115–122 so that the turret may be moved axially of the terminal board 52 without interference by the brushes.

The shaft 32 is thus inserted through the enlarged circular hole 151 until an annular groove 153 near the rear end of the shaft 32 is in the aperture 151. The groove 153 has a width appreciably greater than the thickness of the wall 23, and the diameter of the shaft 32 at the bottom of the groove 153 is slightly less than the width of the slot 55 although the overall diameter of the shaft 32 is greater than the width of the slot 55. Accordingly, with the groove 153 disposed in the aperture 55, the shaft may be moved toward the deck 22 to move the shaft 32 into the V-end of the aperture. Simultaneously, the front plate 24 is moved toward the deck 22 thereby to move a selected one of the inductance units 68 into engagement with the contact brushes on the terminal board 52. The front plate 24 has a notched-out upper corner portion to enable this mode of assembly even though a variable inductance unit 156 necessarily extends from the front of the tuner and is mounted on the depending flange 25. With the front wall 24 thus in place, the screws 26 are used to secure it to the flange 25. In order to journal the shaft 32 in the rear end wall 23, a bearing plate 157 is secured by a plurality of screws 158 to the back side of the wall 23, and the plate extends into the groove 157 in the shaft 32. Preferably, the plate 157 includes an arcuate recess in the upper end thereof, the radius of curvature of the recess being intermediate the radius of the bottom of the groove 157 and the maximum radius of the shaft 32.

Referring now to FIG. 14, there is shown a schematic circuit diagram of the tuner 20. This circuit comprises an antenna input transformer 170 having a pair of primary windings 171 and 172 and a pair of serially connected secondary windings 173 and 174. The primary windings are serially connected across a pair of antenna input terminals 175 and 176 and the junction between the primary windings 171 and 172 is connected to ground through a parallel circuit comprising a resistor 177 and a capacitor 178. The signal voltage which is developed across the secondary windings 173 and 174 is connected between the control grid and the cathode of an RF amplifier tube 181 through the series connection of three capacitors 180, 182 and 183. The junction between the capacitors 182 and 183 is connected to the brush 121 and the cathode of the RF amplifier tube 181 is connected to the brush 120. Consequently, the winding 75 on the selected one of the inductance units 68 is connected between the cathode of the amplifier tube 181 and the junction of the capacitors 182 and 183. The winding 75 and the distributed capacitance thereof as well as the leakage capacitance to ground comprises a tuned input circuit for the RF amplifier 181, and as successive ones of the inductance units 68 are moved into engagement with the contact brushes 115–122, the input circuit to the RF amplifier 181 is tuned to successive ones of the RF carrier frequencies for the selected channels. One of the inductance units 68 may be switched into circuit relationship with the stationary components of the tuner when it is desired to employ the associated receiver to reproduce a UHF television signal. At this time a UHF-IF composite television signal is supplied from a UHF tuner (not shown) to a UHF-IF input terminal 184 which is directly connected to the control grid of the RF amplifier 181.

An AGC voltage from the associated receiver is adapted to be connected to an AGC input terminal 185 which is coupled through a resistor 186 to the control grid of the RF amplifier tube 181. The line to the AGC terminal 185 is connected through a suitable feed-through capacitor 187 which, for RF signals, bypasses the line to ground. The plate circuit of the RF amplifier 181 includes a resonant circuit which comprises the inductance of the coil 74 and the distributed and leakage capacitance thereof. Accordingly, the contact brush 119 is connected to the anode of the RF amplifier 181 and the contact brush 118 is connected through a conductive lead 188 and a feed choke coil 191 to a set of serially connected resistors 192 and 193 which are interconnected between the feed choke 191 and ground. A neutralization coil 194 is connected between the screen grid of the RF amplifier tube 181 and the junction between the resistors 192 and 193, and a bypass capacitor 196 is connected between ground and the lead connecting the coil 194 with the resistors 192 and 193.

In order to couple the amplified RF output signal from the RF amplifier section of the tuner to the mixer, which comprises a tube section 197, the winding 74 is electromagnetically coupled to the winding 73, the winding 73 being electrically connected between the control grid of the mixer tube section 197 and ground. The winding 73 has an inductance value which resonates with its distributed and leakage capacitance at the RF carrier frequency of the selected channel and thus constitutes a tuned input circuit for the mixer section 197. Since the inductance values for the windings 73 and 74 must necessarily be relatively low when the high frequency channels are tuned in, the lead inductance between the junction of the windings 73 and 74 and a capacitor 198, which is connected between the lead 188 and ground, has a value which is a substantial percentage of the values of the inductances 73 and 74 at these high frequencies. This lead inductance may thus cause over-coupling between the windings. Since the minimum length of the lead 188 is determined by the mechanical construction of the tuner and as a practical matter cannot be shortened beyond a predetermined length, means must be provided for effectively reducing the value of this inductance at the high channels. Accordingly, the value of the capacitor 198 is chosen so as to be series resonant with this lead inductance at a frequency substantially above the frequency of channel 13. Consequently, at frequencies below the resonant frequency of this series resonant circuit and, therefore, at all of the frequencies in the VHF television band, the circuit which is connected between ground and the junction between the windings 73 and 74 is capacitive and thus does not cause execessive coupling between the windings 73 and 74. Moreover, at the low channels where undercoupling presents a problem, the capacitance coupling between the junction of the windings 73 and 74 and the ground insures adequate coupling between the RF amplifier and the mixer.

The RF signal which is thus developed across the winding 73 is coupled through a capacitor 201 to the control grid of the mixer section 197. The screen grid of the mixer tube section 197 is connected through a neutralization coil 202 and a resistor 203 to the junction between the feed choke 191 and the resistor 192, and the junction between the coil 202 and the resistor 203 is suitably bypassed for RF frequencies through a capacitor 204.

The mixer tube section 197 is part of a dual purpose tube 205 which further includes a triode section 206 which provides the necessary amplification for the generation of local oscillations. Accordingly, the oscillator winding 72, which is adjustable and adapted to be connected across the contact brushes 115 and 116, is resonant at the local oscillator frequency and provides a positive feedback between the anode of the oscillator triode section 206 and the control grid thereof. More specifically, the contact brush 115 is connected to the anode through a coil 207 and the contact brush 116 is connnected to the control grid through a coupling capacitor 208. Accordingly, a vernier tuning capacitor 211 is connected between the brush 115 and ground, and the coil 207 equalizes the vernier tuning range between the high and low channels. The feedback signal which is applied between the control grid and the cathode of the oscillator triode 206 is developed across a capacitor 213 which is connected between the control grid of the triode 206 and ground, the cathode of the triode 206 also being connected to ground. Conventionally, a grid leak resistor 212 is also connected between the cathode and control grid of the oscillator 206.

A portion of the locally developed oscillations are coupled from the resonant circuit including the winding 72 to the control grid of the mixer section 197 by means of a capacitor 214 which is connected to the contact brush 117. Accordingly, the locally developed RF signal is added to the RF signal across a resistor 215 which is connected between the control grid of the mixer tube 197 and ground. Conventional mixing across a nonlinear impedance occurs in the mixer 197 and the resultant IF signal is coupled from the mixer anode through the variable inductance 156 across a bypass capacitor 218 and thence to an IF output terminal 221. A source of B+ voltage connected to a B+ terminal 222 provides the energization voltage for the three tube sections in the tuner, a load resistor 233 being connected between the B+ terminal 222 and the coil 217 and a resistor 224 being connected between the B+ terminal 222 and the brush 115.

In order to provide improved coupling of the input signal from the antenna input transformer 170 to the tuned input circuit of the RF amplifier 181, means are provided for short-circuiting the capacitor 182 when the ones of the inductance devices 68 which correspond to the high channels are connected in circuit relationship with the other circuits of the tuner. Those inductance units 68 which correspond to the high channels, where an increased capacitance between the secondary winding 173 and the tuned input circuit of the RF amplifier 181 is necessary, are each provided with a short-circuiting conductor 227 which is connected between the terminals 91 and 92. Therefore, when these particular inductance devices 68 including the short-circuiting conductor 227 are switched into circuit relationship with the stationary components of the tuner, the capacitor 182 is short-circuited thereby to provide improved coupling at the high frequencies.

Other arrangements could be provided for changing the coupling between the secondary winding of the antenna coupling transformer 170 and the RF input signal for the high channel inductance units. For example, the capacitor 180 could be eliminated, the capacitance 182 would then be replaced by a short-circuiting conductor, and the brush 122 would be connected to a tap on the winding 173. Accordingly, when a short-circuiting conductor 227 is connected between the brushes 121 and 122, a portion of the inductance of the secondary winding 173 is short-circuited thereby to change the coupling characteristics between the antenna and the RF input signal. Similarly, other arrangements could be provided employing the additional switching terminal 92 and the associated brush 122.

While particular embodiments of the invention have been shown, it will be understood, of course, that it is not desired that the invention be limited thereto since modifications may be made, and it is, therefore, contemplated by the appended claims to cover any such modifications as fall within the true spirit and scope of the invention.

Having thus described the invention, what is claimed and desired to be secured by Letters Patent of the United States is:

1. A coil assembly for use in a turret type tuner, comprising a solid elongated insulating support member, a plurality of conductive terminal members positioned at spatially disposed locations along the length of said support member in slots extending transversely therethrough, a plurality of coils wound around said support member, each of said terminal members having an arcuate contact engaging portion which extends beyond the periphery of said support member along one side thereof and a shank portion extending beyond the periphery of said support member along another side thereof, said coils being wound on said support member in such manner that said contact engaging portions of said terminal members project beyond the turns of said coils, and means connecting the end turns of said coils to the shank portions of different ones of said terminal members.

2. A coil assembly for use in a turret type tuner, comprising a solid elongated support member of insulating material, means defining a plurality of transversely extending grooves spaced along the length of said support member, a plurality of conductive terminal members positioned in said grooves and each having a curved contact engaging portion and a notched wire receiving portion, said wire receiving portions of said terminal members being displaced from said contact engaging portions around the periphery of said support member and said contact engaging portions being positioned in alignment along the length of said support member, a plurality of coils wound around said support member, and means securing the end portions of said coils in the notches in said wire receiving portions of different ones of said terminal members.

3. A coil assembly for use in a turret type tuner having stator contacts, comprising a solid elongated insulating support member, a plurality of conductive terminal members spaced along the length of said support member and extending transversely therethrough, said conductive terminal members having first stator contact engaging portions adapted to establish sliding contact with said stator contacts and projecting from said support member along one side thereof and having shank portions extending from another side of said support member, and a plurality of coils wound around said support member, each of said coils being positioned between a different pair of said conductive terminal members and having the ends thereof connected to said shank portions of adjacent terminal members of each pair.

4. A coil assembly for use in a turret type tuner, comprising a solid elongated insulating support member, a plurality of conductive terminal members positioned along the length of said support member, each of said terminal members having a contact making portion protruding beyond one side of said support member and a bifurcated portion extending beyond the side of said support member diametrically opposite to said one side, and a plurality of coils wound around said support member, each of said coils being positioned between a different pair of said conductive terminal members and having the ends thereof connected to the bifurcated portions of adjacent terminal members of each pair.

5. A coil assembly for use in a turret type tuner, comprising a solid elongated support member of insulating material, a plurality of conductive terminal members extending transversely through said support member at spatially disposed locations along the length thereof and each projecting from opposite sides of said support member, means defining curved contact engaging surfaces on those portions of said terminal members which project from one side of said support member, a plurality of coils wound around said support member, and means connecting the end turns of said coils to those portions of said terminal members which project from the opposite side of said support member.

6. In a turret tuner of the type having a selector shaft with spaced discs mounted thereon and adapted to support around the periphery thereof a plurality of coil assemblies, a coil assembly comprising a solid elongated support member of insulating material, a plurality of conductive terminal members extending transversely with respect to said support member at spatially disposed locations along the length thereof and each projecting from opposite sides of said support member, means defining contact engaging surfaces on those portions of said terminal members which project from one side of said support member, means defining a wire receiving notch in those portions of said terminal members which project from the opposite side of said support member, a plurality of coils wound around said support member, at least two of said coils being each positioned between a different pair of said conductive terminal members, the end turns of said coils being positioned in said wire receiving notches of said terminal members and conductively bonded thereto.

7. A coil assembly for use in a turret type tuner, comprising a solid elongated support member of insulating material, a plurality of conductive terminal members extending transversely with respect to said support member at spatially disposed locations along the length thereof and each projecting from opposite sides of said support member, means defining beveled contact engaging surfaces on those portions of said terminal members which project farthest from one side of said support member, means defining a wire receiving notch in those portions of said terminal members which project from the opposite side of said support member, the bottom of said notch being positioned above said opposite side of said support member, a plurality of coils wound around said support member, the end turns of said coils being positioned in said wire receiving notches of said terminal members and conductively bonded thereto.

8. A coil assembly for use in a turret type tuner, comprising a solid elongated support member of insulating material, a plurality of conductive terminal members extending transversely with respect to said support member at spatially disposed locations along the length thereof and each projecting from opposite sides of said support member, means defining contact engaging surfaces on those portions of said terminal members which project from one side of said support member, a plurality of coils wound around said support member, at least two of said coils being each positioned between a different pair of said conductive terminal members, means connecting the end turns of said coils to those portions of said terminal members which project from the opposite side of said support member, means defining an axial bore in one end of said support member which extends into the central region of one of said coils wound on said support member, and an inductance adjusting device adjustably mounted in said bore.

References Cited by the Examiner

UNITED STATES PATENTS

| | | | |
|---|---|---|---|
| 1,480,454 | 1/1924 | McLaughlin | 336—150 |
| 1,524,976 | 2/1925 | Kautz | 336—150 X |
| 2,539,926 | 1/1951 | Rainwater | 336—200 X |
| 2,611,807 | 9/1952 | Lazzery | 334—50 X |
| 2,657,365 | 10/1953 | Lazzery | 334—51 X |
| 2,808,515 | 10/1957 | Nestlerode et al. | 336—136 X |
| 3,083,339 | 3/1963 | Bell | 334—50 |

FOREIGN PATENTS

| | | |
|---|---|---|
| 1,155,104 | 11/1957 | France. |
| 632,625 | 11/1949 | Great Britain. |
| 975,608 | 11/1964 | Great Britain. |

ROBERT K. SCHAEFER, *Primary Examiner.*

JOHN F. BURNS, E. JAMES SAX, *Examiners.*

T. J. KOZMA, *Assistant Examiner.*